United States Patent
Yang et al.

(10) Patent No.: US 8,351,189 B2
(45) Date of Patent: Jan. 8, 2013

(54) PORTABLE ELECTRONIC DEVICE

(75) Inventors: Jui-Ching Yang, Shulin (TW); Ching-Feng Hsieh, Taipei (TW)

(73) Assignee: Askey Computer Corp. (TW)

( * ) Notice: Subject to any disclaimer, the term of this patent is extended or adjusted under 35 U.S.C. 154(b) by 299 days.

(21) Appl. No.: 12/954,999

(22) Filed: Nov. 29, 2010

(65) Prior Publication Data

US 2012/0087070 A1   Apr. 12, 2012

(30) Foreign Application Priority Data

Oct. 12, 2010   (TW) .............................. 99134711 A

(51) Int. Cl.
*H05K 5/00*   (2006.01)
(52) U.S. Cl. .............................. 361/679.01; 361/679.02
(58) Field of Classification Search ............. 361/679.01, 361/679.02, 679.4, 679.45, 679.31; 455/575.1, 455/575.4
See application file for complete search history.

(56) References Cited

U.S. PATENT DOCUMENTS

| | | | |
|---|---|---|---|
| 6,979,210 B2 * | 12/2005 | Regen et al. | 439/131 |
| 7,004,780 B1 * | 2/2006 | Wang | 439/353 |
| 7,125,265 B2 * | 10/2006 | Weng | 439/131 |
| 7,787,243 B2 * | 8/2010 | Salazar et al. | 361/679.31 |

FOREIGN PATENT DOCUMENTS

| | | |
|---|---|---|
| TW | M360428 | 7/2009 |
| TW | M376871 U1 | 3/2010 |

* cited by examiner

*Primary Examiner* — Anthony Haughton
(74) *Attorney, Agent, or Firm* — Schmeiser, Olsen & Watts, LLP

(57) ABSTRACT

A portable electronic device includes a body, a casing, and a resilient element. The casing accommodates the body such that the body can slide within the casing. The casing has an opening through which an electrical connection unit connected to the body protracts out of, or retracts into, the casing. The resilient element has an end connected to the casing and another end abutting against the body. The resilient element exerts a resilient restoring force upon the body in response to the sliding of the body. The casing has a stop structure configured to operate in conjunction with an engagement structure of the body and thereby limit the range of the sliding of the body. The engagement structure can be disengaged from the stop structure to separate the body from the casing. Accordingly, the portable electronic device has multiple uses, namely quick maintenance, easy assembly, body protection, and automatic accommodation.

9 Claims, 3 Drawing Sheets

PORTABLE ELECTRONIC DEVICE

CROSS-REFERENCE TO RELATED APPLICATION

This non-provisional application claims priority under 35 U.S.C. §119(a) on Patent Application No(s). 099134711 filed in Taiwan, R.O.C. on Oct. 12, 2010, the entire contents of which are hereby incorporated by reference.

FIELD OF THE TECHNOLOGY

The present invention relates to portable electronic devices, and more particularly, to a portable electronic device capable of receiving therein an electrical connection unit automatically.

BACKGROUND

With memory devices becoming more popular with people and memory capacity becoming larger, portable plug-and-play (PnP) electronic products are in wide use. Conventional portable electronic devices each comprise a casing and a body enclosed therein. The body of the conventional electronic device comprises a storage unit and an electrical connection unit protruding out of the casing. The storage unit can be connected to an external electrical connection end via the electrical connection unit so as to enable data transmission. The external electrical connection end is exemplified by a USB flash drive or a USB stick.

As mentioned earlier, the electrical connection unit is exposed from the casing. The casing consists of an upper cover and a lower cover. Due to the two aforesaid features, conventional portable electronic devices are vulnerable. The electrical connection unit is likely to be hit and damaged, because it is exposed from the casing. The upper and lower covers can be crushed as a result of a hit on the casing. To overcome the aforesaid drawbacks of conventional portable storage devices, protection for the electrical connection units of recently developed portable storage devices is improved. For example, the electrical connection unit of a portable storage device is covered with a protective cover whenever the portable storage device is idle. Alternatively, the electrical connection unit is retractable into the casing. Normally, the retraction of the retractable electrical connection unit is performed manually by means of a manually operated rod. Nonetheless, it is not uncommon for the portable electronic device to become inoperable after the manually operated rod has severed under an inappropriate force.

Taiwan Patent No. M360428, entitled Connector Retractable Device for USB Flash Drive, discloses two bilaterally disposed spring structures for use with a USB flash drive such that a push exerted on the rear end of the body of the USB flash drive by the user is followed by automatic retraction and resultant positioning of the body of the USB flash drive under the reaction of the springs abutting against the body of the USB flash drive. However, the spring structures of Taiwan Patent No. M360428 have the following drawbacks: failure to demonstrate ease of use, user-based operation-dependent retraction function, and the likelihood of damaging the body, or crushing the upper and lower covers, of the USB flash drive as a result of a hit thereon. Similar drawbacks are found in Taiwan Patent No. M376871 entitled Flash Drive Having Retractable Connector.

Accordingly, it is imperative to provide a portable electronic device advantageously characterized by enhanced protection for its body and a electrical connection unit, a reinforced casing structure for protecting the received electrical connection unit and body, automatic accommodation of the electrical connection unit in the casing without requiring a user to touch a driving rod, and a structure conducive to easy separation of the body and the casing so as to facilitate maintenance.

SUMMARY

It is an objective of the present invention to provide a portable electronic device capable of receiving an electrical connection unit therein automatically without user-based operation as soon as the electrical connection unit is disconnected from an external circuit.

It is another objective of the present invention to provide a portable electronic device that allows the electrical connection unit to be safely received inside the portable electronic device whenever the portable electronic device is not in use and enables easy and quick removal of the electrical connection unit while maintenance is underway.

In order to achieve the above and other objectives, the present invention provides a portable electronic device comprising: a body comprising a positioning structure, an engagement structure, and an electrical connection unit, the positioning structure having an end provided with a pin, and the electrical connection unit being connectable to an external circuit; a casing for receiving the body slidable within the casing in a direction, the casing having an opening and a stop structure, the opening allowing the electrical connection unit to protract out of the casing or retract into the casing while the body is sliding, the stop structure limiting a sliding range of the body when operating in conjunction with the engagement structure, the casing further having an inner wall disposed thereon with a one-way circular track for receiving the pin, the positioning structure being slidable with the body so as to drive the pin to slide within the one-way circular track, and the one-way circular track being provided with a reverse recess positioned in vicinity of the opening to allow the pin to stay in the reverse recess; and a resilient element having an end coupled to the casing and another end configured to abut against the body, and exerting a resilient restoring force upon the body in response to the sliding of the body.

Compared to the prior art, the present invention provides a portable electronic device that allows an electrical connection unit to be automatically received inside the portable electronic device as soon as the body of the electrical connection unit is disconnected from an external circuit. Furthermore, a casing of the portable electronic device is integrally formed as a unitary unit so as to reinforce the portable electronic device. In addition, not only is the electrical connection unit fixed to the inside of the portable electronic device by means of an engagement structure and a stop structure, but maintenance performed on the portable electronic device is speeded up and rendered easy by disengagement of the engagement structure.

BRIEF DESCRIPTION OF THE DRAWINGS

A detailed description of further features and advantages of the present invention is given below so that a person skilled in the art can understand and implement the technical contents of the present invention and readily comprehend the objectives, features, and advantages thereof by reviewing the disclosure of the present specification and the appended claims in conjunction with the accompanying drawings, in which:

DETAILED DESCRIPTION

Figure 1:
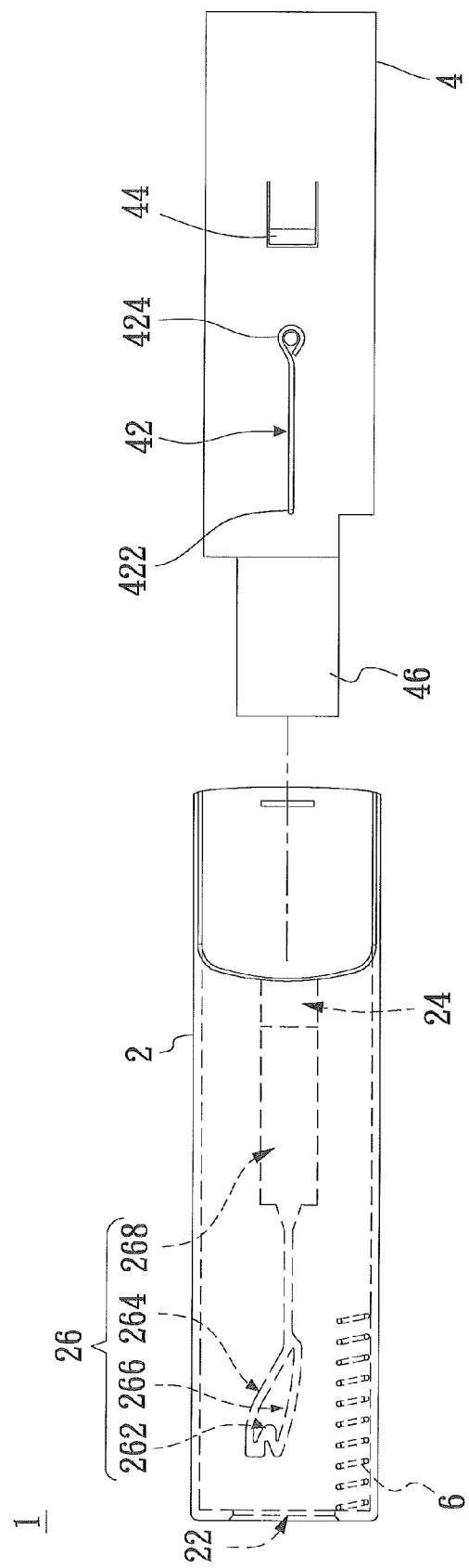
FIG. 1 is a schematic view of a portable electronic device.

Referring to FIG. 1 through FIG. 5, there are shown schematic views of a portable electronic device in an embodiment of the present invention. As shown in FIG. 1, a portable electronic device 1 comprises a casing 2, a body 4, and a resilient element 6. The casing 2 has an opening 22 and a stop structure 24. A one-way circular track 26 is disposed on the inner wall of the casing 2. The one-way circular track 26 is provided with a reverse recess 262 positioned in the vicinity of the opening 22. The body 4 comprises a positioning structure 42, an engagement structure 44, and an electrical connection unit 46. The positioning structure 42 has one end provided with a pin 422 and the other end provided with a sharply-bent hook 424 fixed to the body 4. The resilient element 6 has one end coupled to the casing 2 and the other end abutting against the body 4. The resilient element 6 exerts a resilient restoring force upon the body 4 in response to the sliding of the body 4.

Figure 2:
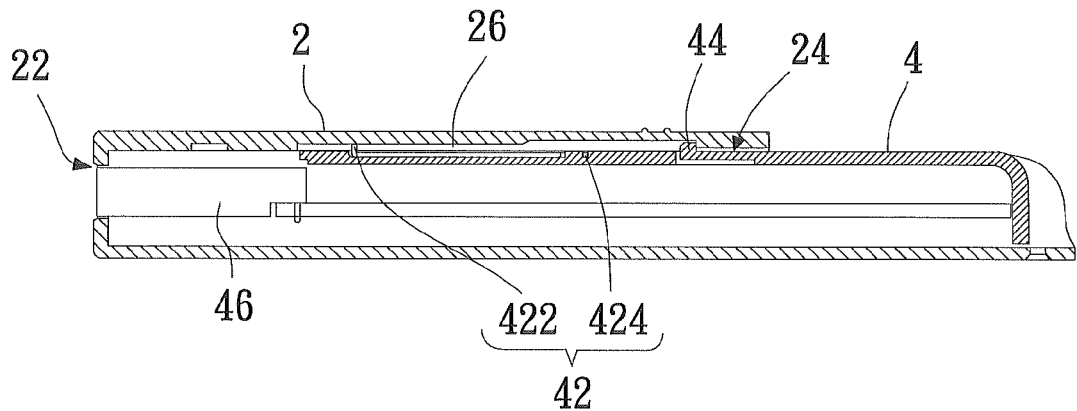
FIG. 2 is a cross-sectional schematic view of the portable electronic device shown in FIG. 1.
Figure 3:
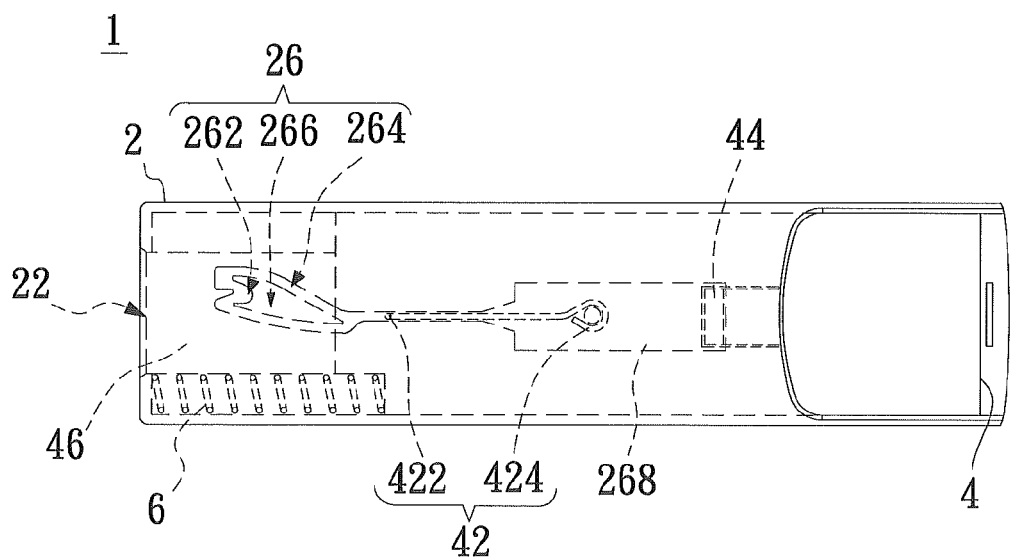
FIG. 3 is a schematic view of the portable electronic device with an electrical connection unit received in a casing.
Figure 4:
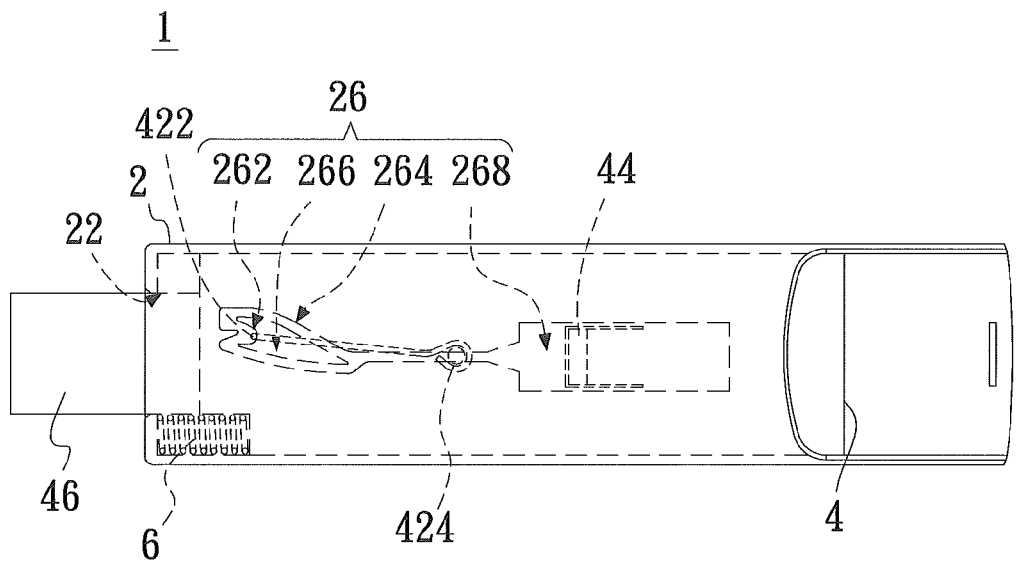
FIG. 4 is a schematic view of the portable electronic device with the electrical connection unit protruding out of the casing.

Referring to FIG. 2, there is shown a cross-sectional schematic view of the portable electronic device 1 shown in FIG. 1. The casing 2 has a receiving space for receiving the body 4. The body 4 is slidable within the receiving space of the casing 2 in a direction. The electrical connection unit 46 of the body 4 corresponds in position to the opening 22, thereby allowing the electrical connection unit 46 to protract out of the casing 2 or retract into the casing 2 while the body 4 is sliding, as shown in FIGS. 3 and 4. The stop structure 24 limits the sliding range of the body 4 slidable within the casing 2 when operating in conjunction with the engagement structure 44. The engagement structure 44 restricts the movement of the body 4 to the receiving space of the casing 2 as soon as the body 4 slides into the casing 2. The body 4 cannot be separated from the casing 2 by sliding, unless the engagement structure 44 is disengaged from the stop structure 24. For example, to move the body 4 into the casing 2, a user may press the engagement structure 44 with a tool such that the engagement structure 44 lies lower than the stop structure 24, and then the user slides the body 4 into the casing 2; meanwhile, the engagement structure 44 which has become unrestrained restores to its original position as soon as the body 4 slides into the casing 2, whereas the stop structure 24 confines the body 4 to the receiving space of the casing 2. To take the casing-bound body 4 out of the casing 2 for a maintenance-related purpose, the user may press the engagement structure 44 with a tool to remove the restriction otherwise imposed upon the engagement structure 44 by the stop structure 24, as shown in FIG. 1. As mentioned earlier, the body 4 can be easily put into or taken out of the casing 2 by pressing the engagement structure 44, and thus it is feasible for the casing 2 to be integrally formed as a unitary unit so as to reinforce the portable electronic device 1.

The one-way circular track 26 is disposed on the inner wall of the casing 2. The one-way circular track 26 further comprises a first track 264 and a second track 266 in communication with each other. Both the first track 264 and the second track 266 are in communication with the reverse recess 262 positioned in the vicinity of the opening 22. The pin 422 can stay in the reverse recess 262. The one-way circular track 26 accommodates the pin 422 of the positioning structure 42 as soon as the body 4 slides into the casing 2. The positioning structure 42 slides together with the body 4, and in consequence the pin 422 slides within the one-way circular track 26. For example, the sliding of the body 4 in the direction of the opening 22 causes the pin 422 to slide along the first track 264 and enter the reverse recess 262 and causes the electrical connection unit 46 to protract out of the casing 2. Conversely, the sliding of the body 4 away from the opening 22 causes the pin 422 to leave the reverse recess 262 and slide along the second track 266 and causes the electrical connection unit 46 to retract into the casing 2.

The one-way circular track 26 further comprises a receiving portion 268 for receiving the positioning structure 42; in other words, both the first track 264 and the second track 266 extend from the receiving portion 268, communicate with each other, and communicate with the reverse recess 262 positioned in the vicinity of the opening 22. As a result, the pin 422 can move from the receiving portion 268 to the reverse recess 262 by sliding along the first track 264, and can move from the reverse recess 262 to the receiving portion 268 by sliding along the second track 266.

At the moment that the body 4 slides into the casing 2, the resilient element 6 abuts against the body 4 and thus exerts a resilient restoring force upon the body 4 in response to the sliding of the body 4 within the casing 2. For example, the sliding of the body 4 in the direction of the opening 22 causes the pin 422 to follow the first track 264 to the reverse recess 262, and in consequence the body 4 compresses and deforms the resilient element 6, as shown FIG. 4. Conversely, upon a pause in the sliding of the body 4 and commencement of withdrawal of the pin 422 from the reverse recess 262, the resilient element 6 exerts a resilient restoring force upon the body 4 to thereby move the body 4 backward, and the pin 422 of the body 4 follows the second track 266 to the receiving portion 268, as shown in FIG. 3.

In practice, the user may push the body 4 of the portable electronic device 1, such that the body 4 slides toward the opening 22 of the casing 2 to thereby allow the electrical connection unit 46 of the body 4 to protract out of the casing 2 through the opening 22; meanwhile, the pin 422 of the positioning structure 42 follows the first track 264 of the one-way circular track 26 to the reverse recess 262. At this point of time, the body 4 slides toward the opening 22 of the casing 2 to thereby compress and deform the resilient element 6. The compressed resilient element 6 exerts a resilient restoring force upon the body 4. Once the body 4 slides toward the opening 22 to such an extent that the pin 422 enters the reverse recess 262, the pin 422 will stay in the reverse recess 262 to assist the electrical connection unit 46 in being fixed to this position, and in consequence the portable electronic device 1 is connected to an external circuit through the electrical connection unit 46.

Afterward, the user may exert a force upon the casing 2 in attempt to withdraw the portable electronic device 1 from the external circuit. In response to the user's effort, the external circuit exerts an equal reaction upon the electrical connection unit 46 to thereby assist the pin 422 in exiting the reverse recess 262 and entering the second track 26. Once the user withdraws the portable electronic device 1 completely, the resilient restoring force corresponding to the compression of the resilient element 6 is exerted upon the body 4 such that the body 4 will slide away from the opening 22; meanwhile, the pin 422 of the body 4 follows the second track 266 of the one-way circular track 26 to the receiving portion 268. As mentioned earlier, the body 4 is pushed by a resilient restoring force to thereby slide away from the opening 22, and, as a result, the electrical connection unit 46 is automatically received in the casing 2, thereby dispensing the user's operating the electrical connection unit 46 with a manual rod.

Figure 5:
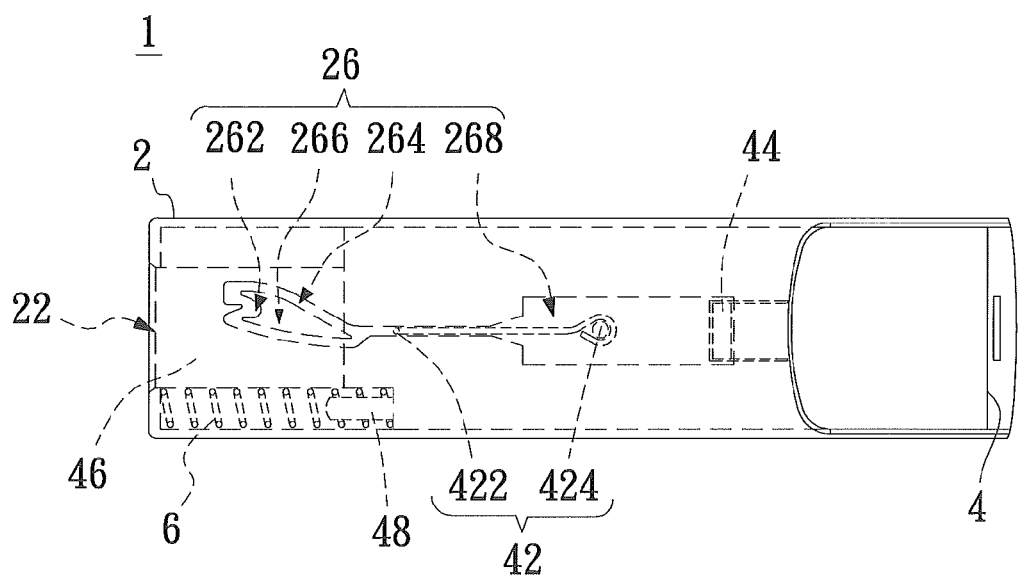
FIG. 5 is a schematic view of a body of the portable electronic device, showing that the body has a post therein.

In addition, the body 4 further comprises a post 48. The resilient element 6 is put around the post 48 as soon as the body 4 slides into the casing 2; in so doing, the resilient element 6 is fixed between the body 4 and the casing 2 by means of the post 48, such that the functionality of the resilient element 6 is brought into full play, as shown in FIG. 5.

The body 4 is a printed circuit board, an electronic component, a memory device, and/or a storage device. The electrical connection unit 46 is a universal serial bus (USB), a serial advanced technology attachment (SATA), an external serial advanced technology attachment (E-SATA), an IEEE 1394 interface (FireWire), or a high-definition multimedia interface (HDMI).

Compared to the prior art, the present invention provides a portable electronic device that allows an electrical connection unit to be automatically received inside the portable electronic device as soon as the body of the electrical connection unit is disconnected from an external circuit. Furthermore, a casing of the portable electronic device is integrally formed as a unitary unit so as to reinforce the portable electronic device. In addition, not only is the electrical connection unit fixed to the inside of the portable electronic device by means of an engagement structure and a stop structure, but maintenance performed on the portable electronic device is speeded up and rendered easy by disengagement of the engagement structure.

The foregoing embodiments are provided to illustrate and disclose the technical features of the present invention so as to enable persons skilled in the art to understand the disclosure of the present invention and implement the present invention accordingly, and are not intended to be restrictive of the scope of the present invention. Hence, all equivalent modifications and variations made to the foregoing embodiments without departing from the spirit and principles in the disclosure of the present invention should fall within the scope of the present invention as set forth in the appended claims.

What is claimed is:

1. A portable electronic device, comprising:
a body comprising a positioning structure, an engagement structure, and an electrical connection unit, the positioning structure having an end provided with a pin, and the electrical connection unit being connectable to an external circuit;
a casing for receiving the body slidable within the casing in a direction, the casing having an opening and a stop structure, the opening allowing the electrical connection unit to protract out of the casing or retract into the casing while the body is sliding, the stop structure limiting a sliding range of the body when operating in conjunction with the engagement structure, the casing further having an inner wall disposed thereon with a one-way circular track for receiving the pin, the positioning structure being slidable with the body so as to drive the pin to slide within the one-way circular track, and the one-way circular track being provided with a reverse recess positioned in vicinity of the opening to allow the pin to stay in the reverse recess; and
a resilient element having an end coupled to the casing and another end configured to abut against the body, and exerting a resilient restoring force upon the body in response to the sliding of the body.

2. The portable electronic device of claim 1, wherein the body further comprises a post whereby the resilient element is fixed between the body and the casing.

3. The portable electronic device of claim 1, wherein the casing is integrally formed as a unitary unit.

4. The portable electronic device of claim 1, wherein the positioning structure having another end provided with a hook bent sharply and fixed to the body.

5. The portable electronic device of claim 1, wherein the one-way circular track further comprises a receiving portion for receiving the positioning structure.

6. The portable electronic device of claim 5, wherein the one-way circular track further comprises a first track and a second track, the first and second tracks extending from the receiving portion to communicate with each other and communicate with the reverse recess positioned in vicinity of the opening.

7. The portable electronic device of claim 6, wherein the pin slides along the first track to move from the receiving portion to the reverse recess and slides along the second track to move from the reverse recess to the receiving portion.

8. The portable electronic device of claim 1, wherein the electrical connection unit is one of a universal serial bus (USB), a serial advanced technology attachment (SATA), an external serial advanced technology attachment (E-SATA), an IEEE 1394 interface (FireWire), and a high-definition multimedia interface (HDMI).

9. The portable electronic device of claim 1, wherein the body is at least one of a printed circuit board, an electronic component, a memory device, and a storage device.

* * * * *